United States Patent
Kato

(10) Patent No.: US 11,146,229 B2
(45) Date of Patent: Oct. 12, 2021

(54) FILTER AND MULTIPLEXER

(71) Applicant: Murata Manufacturing Co., Ltd., Kyoto (JP)

(72) Inventor: Masanori Kato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/460,362

(22) Filed: Jul. 2, 2019

(65) Prior Publication Data
US 2020/0052672 A1 Feb. 13, 2020

(30) Foreign Application Priority Data

Aug. 10, 2018 (JP) .............................. JP2018-151776

(51) Int. Cl.
*H03H 7/01* (2006.01)
*H03H 9/46* (2006.01)

(52) U.S. Cl.
CPC ........ *H03H 7/0115* (2013.01); *H03H 7/0161* (2013.01); *H03H 9/46* (2013.01)

(58) Field of Classification Search
CPC ....... H03H 7/0115; H03H 7/0161; H03H 9/46
USPC .......................................................... 333/185
See application file for complete search history.

(56) References Cited

U.S. PATENT DOCUMENTS

| | | | |
|---|---|---|---|
| 2005/0025324 A1* | 2/2005 | Takata | H03H 9/6483 381/190 |
| 2015/0220665 A1* | 8/2015 | Turner | H03H 9/64 716/103 |
| 2016/0204763 A1 | 7/2016 | Tani | |
| 2019/0334563 A1* | 10/2019 | Elbrecht | H04B 1/0057 |
| 2020/0028493 A1* | 1/2020 | Ta | H03H 9/02007 |

FOREIGN PATENT DOCUMENTS

| | | | |
|---|---|---|---|
| JP | H07-38376 A | 2/1995 | |
| JP | H0738376 | * 2/1995 | ............. H01P 1/213 |
| JP | H08-032402 A | 2/1996 | |
| JP | H11-88100 A | 3/1999 | |
| JP | 2006-128881 A | 5/2006 | |
| JP | 2015-119452 A | 6/2015 | |
| WO | 2015/045793 A1 | 3/2017 | |

OTHER PUBLICATIONS

Bonastre, A., "RF filters and Multiplexer Based on Acoustic Wave Technologies with Ladder-type and cross coupled technologies", published as a Ph.D. dissertation of Universitat Autònoma de Barcelona in Sep. 2016. (Year: 2016).*
Notice of Reasons for Rejection for JP Application No. 2018-151776 dated Jan. 19, 2021.

* cited by examiner

*Primary Examiner* — Hafizur Rahman
(74) *Attorney, Agent, or Firm* — Pearne & Gordon LLP

(57) ABSTRACT

A filter having a pass band includes a series circuit in which a series arm resonator and a first inductor are connected in series with each other and which forms at least part of a signal path R connecting a first input/output terminal and a second input/output terminal and a parallel arm resonator connected between one end of the series circuit and a ground. The series circuit becomes inductive in the pass band. An anti-resonant frequency of the series arm resonator is higher than a frequency at a higher-frequency end of the pass band. A resonant frequency of the parallel arm resonator is higher than the anti-resonant frequency of the series arm resonator.

11 Claims, 6 Drawing Sheets

FIG. 3
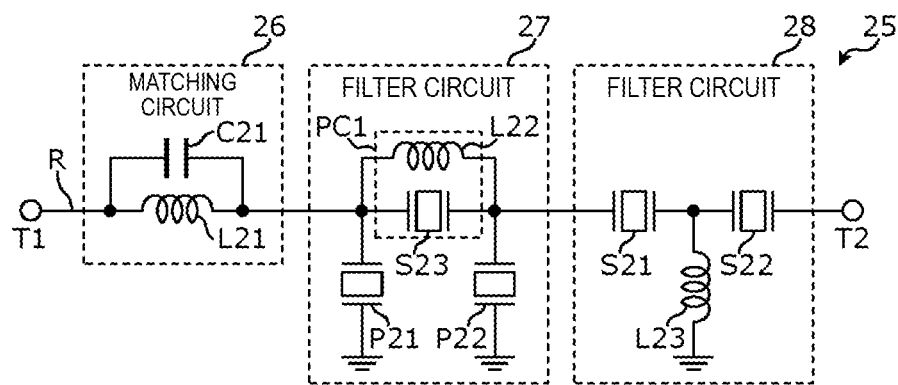
FIG. 4   RESONANCE CHARACTERISTICS AND BANDPASS CHARACTERISTICS
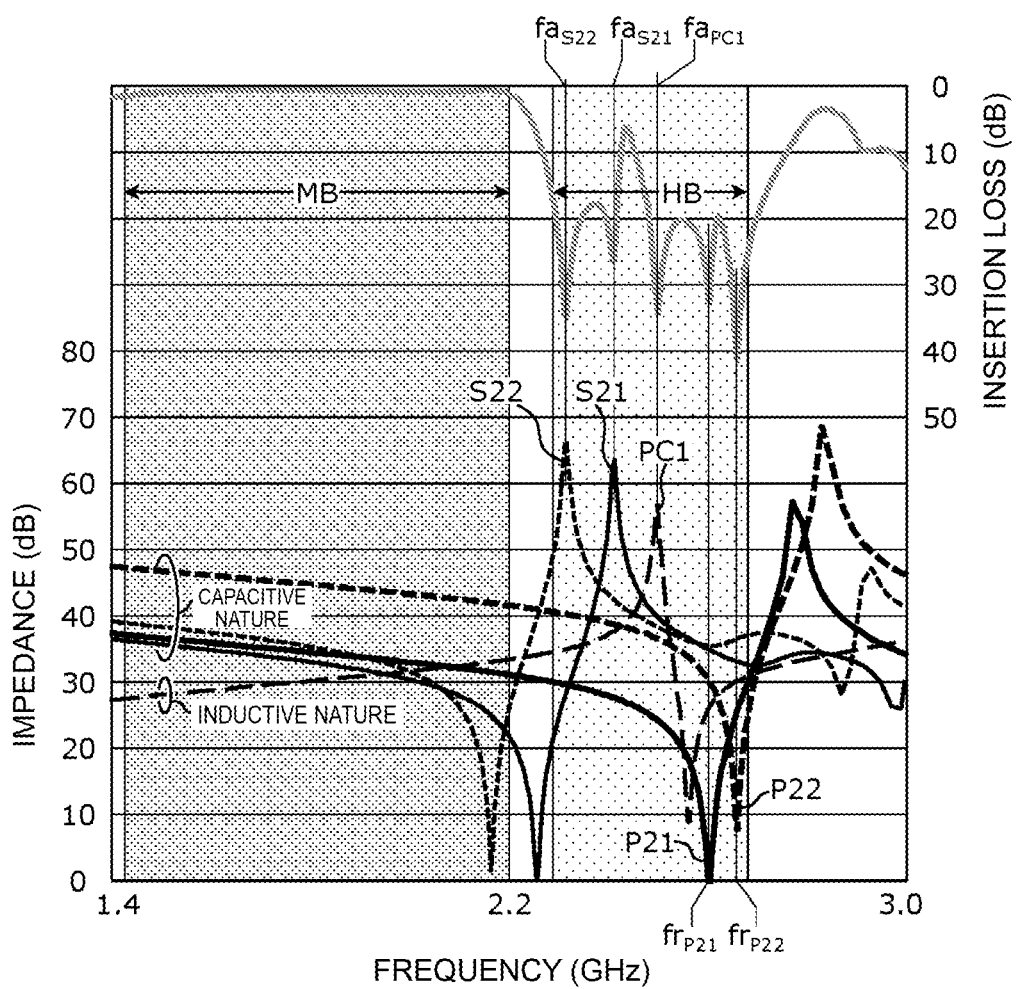

FILTER AND MULTIPLEXER

This application claims priority from Japanese Patent Application No. 2018-151776 filed on Aug. 10, 2018. The content of this application is incorporated herein by reference in its entirety.

BACKGROUND OF THE DISCLOSURE

1. Field of the Disclosure

The present disclosure relates to a filter and a multiplexer.

2. Description of the Related Art

As a multiplexer in which one ends of a plurality of filters are connected in common, a diplexer has been proposed which includes a high pass filter and a low pass filter that are LC filters including respective parallel resonance circuits (see, for example, Japanese Unexamined Patent Application Publication No. 2006-128881).

BRIEF SUMMARY OF THE DISCLOSURE

With the release of a new frequency band and the narrowing of a gap between frequency bands as a backdrop, a filter in a multiplexer needs to have a wide pass band, a small insertion loss, and steep attenuation characteristics at the ends of a pass band.

It is an object of the present disclosure to provide a filter that has a wide pass band, steep attenuation characteristics at the ends of the pass band, and a small insertion loss, and a multiplexer including such a filter.

A filter according to a preferred embodiment of the present disclosure is a filter having a pass band. The filter includes a series circuit in which a series arm resonator and a first inductor are connected in series with each other and which forms at least part of a signal path connecting a first input/output terminal and a second input/output terminal and a parallel arm resonator connected between one end of the series circuit and a ground. The series circuit becomes inductive in the pass band.

In the filter according to a preferred embodiment of the present disclosure, the series circuit including the series arm resonator and the parallel arm resonator are connected in a ladder form. By forming each of the series arm resonator and the parallel arm resonator using an elastic wave resonator, steep attenuation characteristics at the ends of the pass band, which are typical characteristics of ladder elastic wave filters, can be obtained on the basis of an attenuation pole formed by the anti-resonance of the series arm resonator. Since the series circuit becomes inductive in the pass band, the filter functions as a low pass filter including an LC filter in the pass band. Excellent matching can therefore be easily performed in the whole of the pass band and an insertion loss can be effectively suppressed. As a result, a filter can be obtained which has a small insertion loss while having a wide pass band and steep attenuation characteristics at the ends of the pass band.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 3 is a circuit diagram illustrating an exemplary configuration of a filter that is a reference example;

FIG. 4 is a graph representing exemplary resonance characteristics of a filter that is a reference example;

DETAILED DESCRIPTION OF THE DISCLOSURE

Embodiments of the present disclosure will be described in detail below with reference to the accompanying drawings. The embodiments to be described below represent a comprehensive or concrete example. The numerical values, shapes, materials, components, the arrangement and connection state of the components to be described in the following embodiments are merely examples, and are not intended to limit the present disclosure. In the following embodiments, the expression of "being connected" means not only that components are directly connected to each other by a wiring conductor but also that the components are electrically connected to each other via another circuit component.

First Embodiment

As a filter according to the first embodiment, a filter used in a multiplexer will be described by way of example.

Figure 1:
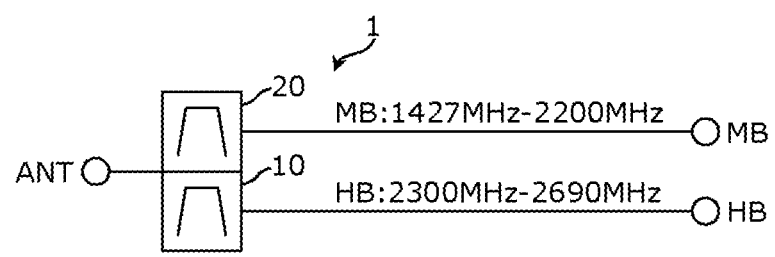
FIG. 1 is a block diagram illustrating an exemplary configuration of a multiplexer including a filter according to a first embodiment.

FIG. 1 is a block diagram illustrating an exemplary configuration of a multiplexer including a filter according to the first embodiment. As illustrated in FIG. 1, a multiplexer 1 includes a filter 10 having a first frequency band as a pass band and a filter 20 having a second frequency band as a pass band. The multiplexer 1 is a diplexer that demultiplexes and multiplexes a signal in the first frequency band and a signal in the second frequency band.

Referring to FIG. 1, for example, the first frequency band is set to fall within the range of approximately 2300 MHz to approximately 2690 MHz and the second frequency band is set to fall within the range of approximately 1427 MHz to approximately 2200 MHz. In this specification, for convenience in reference, the frequency band of approximately 2300 MHz to approximately 2690 MHz is referred to as a high band HB and the frequency band of approximately 1427 MHz to approximately 2200 MHz is referred to as a mid-band MB.

One end of the filter 10 and one end of the filter 20 are connected to an antenna terminal ANT. The other end of the filter 10 is connected to a high band terminal HB, and the other end of the filter 20 is connected to a mid-band terminal MB.

In a case where each of the filters 10 and 20 sufficiently suppresses a signal in the pass band of the other one of them, a single antenna connected to the antenna terminal ANT can simultaneously processes a signal in the high band HB selected in the filter 10 and a signal in the mid-band MB selected in the filter 20 without interference between these signals. That is, carrier aggregation of a communication band in the high band and a communication band in the mid-band MB can be performed with a single antenna.

In order to realize such carrier aggregation, the filter 20 is required to have, for example, the following bandpass characteristics.

Figure 2:
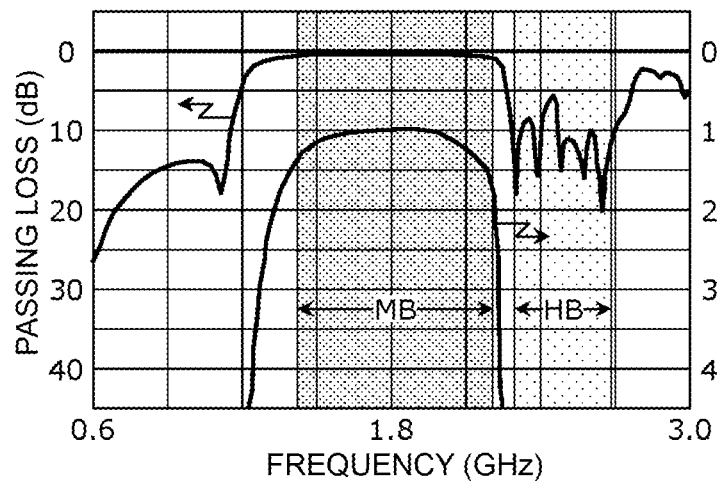
FIG. 2 is a graph describing bandpass characteristics required for a filter according to the first embodiment.

FIG. 2 is a graph describing exemplary bandpass characteristics required for the filter 20 (more specifically, required between the antenna terminal ANT and the mid-band terminal MB in the multiplexer 1). As illustrated in FIG. 2, the filter 20 is required to have a wide pass band (the mid-band MB having the fractional bandwidth of approximately 40% or greater), a wide attenuation band (the high band HB having the fractional bandwidth of approximately 15% or greater), and demultiplexing capability in a narrow frequency gap of approximately 100 MHz (the fractional bandwidth of approximately 4%) between the wide pass band and the wide attenuation band. The fractional bandwidth is the ratio of the difference between the upper end (higher-frequency end) of a band and the lower end (lower-frequency end) of the band to a center frequency.

Thus, in a case where there is a need to realize both a wide pass band and steep attenuation characteristics at the ends of the pass band, it is difficult to realize steep attenuation characteristics in an LC filter and flat bandpass characteristics in a wide frequency band in an elastic wave filter.

The inventor has invented a filter with which such a problem can be solved and proposed the filter in Japanese Patent Application No. 2017-72760 that is a related application (not published at the time of filing of this patent application). In this specification, first, the configuration and effect of a filter in the related application is referred to as a reference example. After that, the configuration and additional effect of a filter in this application is described while comparing this filter with the reference example.

FIG. 3 is a circuit diagram illustrating an exemplary configuration of a filter that is a reference example. As illustrated in FIG. 3, a filter 25 includes a matching circuit 26, and filter circuits 27 and 28. The matching circuit 26 and the filter circuits 27 and 28 are connected in series with each other and form a signal path R connecting input/output terminals T1 and T2. The positional relationship between the filter circuits 27 and 28 may be changed.

The matching circuit 26 includes a capacitor C21 and an inductor L21 connected in parallel to each other on the signal path R.

The filter circuit 27 includes a parallel circuit PC1 provided on the signal path R, a parallel arm resonator P21 connected between one end of the parallel circuit PC1 and the ground, and a parallel arm resonator P22 connected between the other end of the parallel circuit PC1 and the ground. The parallel circuit PC1 includes a series arm resonator S23 and an inductor L22 that are connected in parallel to each other.

The filter circuit 28 includes series arm resonators S21 and S22 connected in series with each other on the signal path R and an inductor L23 connected between the ground and a node between the series arm resonators S21 and S22.

Each of the series arm resonators S21, S22, and S23 and the parallel arm resonators P21 and P22 is formed of an elastic wave resonator.

FIG. 4 is a graph representing exemplary resonance characteristics of the filter 25. Referring to FIG. 4, a plurality of black lines of different line types represent the impedances of the series arm resonators S21 and S22, the parallel circuit PC1, and the parallel arm resonators P21 and P22, and a gray line represents the bandpass characteristics of the filter 25 in the form of insertion loss.

The impedance of the parallel circuit PC1 is the parallel combined impedance of the series arm resonator S23 and the inductor L22, and has a secondary anti-resonance point. An anti-resonant frequency $fa_{S21}$ of the series arm resonator S21, an anti-resonant frequency $fa_{S22}$ of the series arm resonator S22, a secondary anti-resonant frequency $fa_{PC1}$ of the parallel circuit PC1, a resonant frequency $fr_{P21}$ of the parallel arm resonator P21, and a resonant frequency $fr_{P22}$ of the parallel arm resonator P22 are set in the high band HB.

At the anti-resonance points of the series arm resonators S21 and S22, the secondary anti-resonance point of the parallel circuit PC1, and the resonance points of the parallel arm resonators P21 and P22, five attenuation poles are formed in the bandpass characteristics of the filter 25. A stop band connecting the five attenuation poles is formed in the high band HB. In particular, the attenuation pole of the series arm resonator S22 forms steep attenuation characteristics at the higher-frequency end of the mid-band MB.

The whole of the mid-band MB is located on the lower-frequency side of the resonance point of the series arm resonator S21, the secondary anti-resonance point of the parallel circuit PC1, and the resonance points of the parallel arm resonators P21 and P22. The most of the mid-band MB except for the part having the width of the several tens of megahertz at the higher-frequency end is located on the lower-frequency side of the resonance point of the series arm resonator S22. In the whole of the mid-band MB, the series arm resonator S21 and the parallel arm resonators P21 and P22 therefore function as capacitive circuit elements, and the parallel circuit PC1 functions as an inductive circuit element. In most of the mid-band MB, the series arm resonator S22 functions as a capacitive circuit element.

Figure 5:
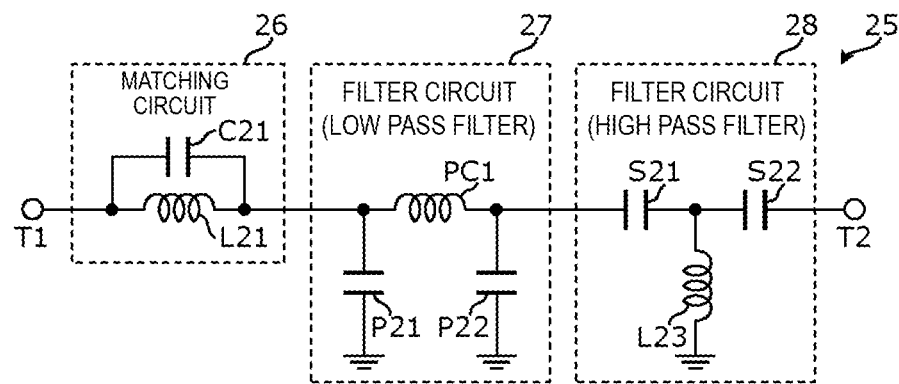
FIG. 5 is an equivalent circuit diagram of a filter that is a reference example in a pass band.

FIG. 5 is an equivalent circuit diagram of the filter 25 in a pass band, that is, the mid-band MB. Referring to FIG. 5, the series arm resonators S21 and S22 and the parallel arm resonators P21 and P22 are represented as capacitors, and the parallel circuit PC1 is represented as an inductor. As illustrated in the equivalent circuit in FIG. 5, in the pass band, the filter circuits 27 and 28 function as a low pass filter and a high pass filter, respectively, each including a simple LC filter that does not use the resonance point and anti-resonance point of a resonator. As a result, flat bandpass characteristics in a wide pass band, which are typical characteristics of an LC filter, can be obtained.

Thus, the filter 25 uses the characteristics of an LC filter and the characteristics of an elastic wave filter in combination in accordance with the locations of the anti-resonant frequencies of series arm resonators and the resonant frequencies of parallel arm resonators, thereby realizing wideband bandpass characteristics and steep attenuation characteristics at the ends of a pass band.

Figure 6:
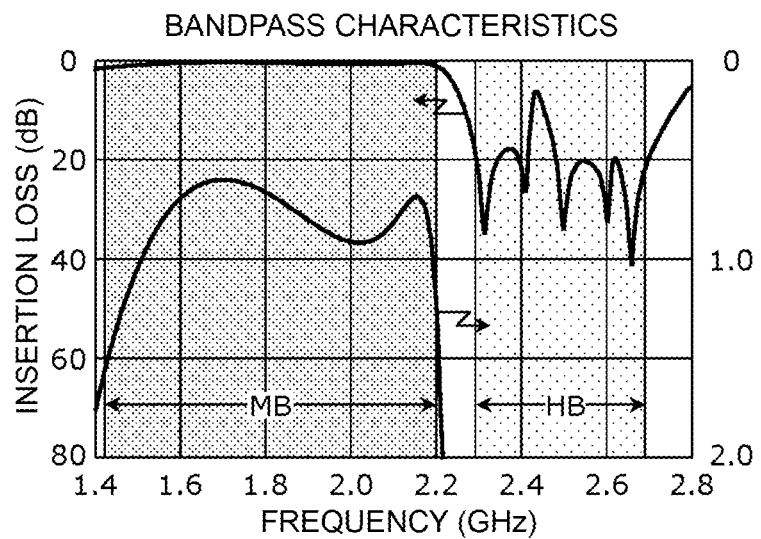
FIG. 6 is a graph representing exemplary bandpass characteristics of a filter that is a reference example.

FIG. 6 is a graph representing exemplary bandpass characteristics of the filter 25. Referring to FIG. 6, the insertion loss illustrated in FIG. 4 is illustrated again and the waveform in the mid-band MB is enlarged. In the example illustrated in FIG. 6, wide-band bandpass characteristics in which an insertion loss is smaller than or equal to a predetermined amount (for example, approximately 1.6 dB) in the whole of the mid-band MB with the fractional bandwidth of approximately 40% or greater are obtained, and steep attenuation characteristics at the higher-frequency end of the mid-band MB are obtained.

Thus, the filter 25 has suitable characteristics as a filter used in the mid-band MB in a diplexer (the multiplexer 1 illustrated in FIG. 1) that demultiplexes and multiplexes a signal in the mid-band MB and a signal in the high band HB.

Figure 7:
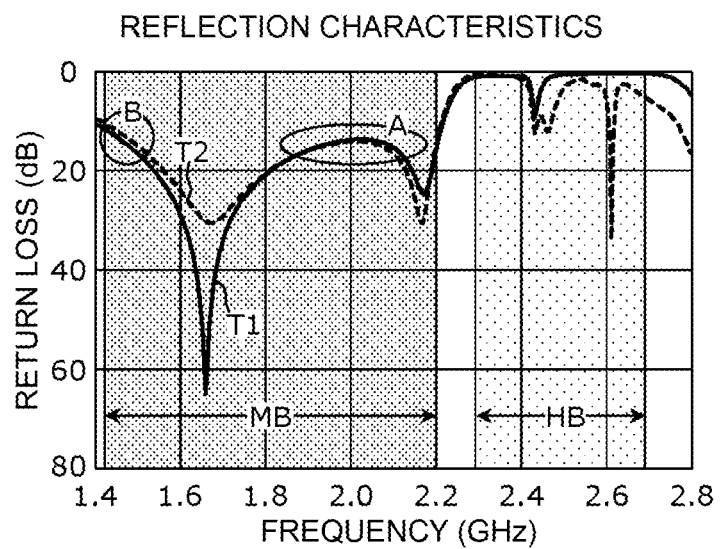
FIG. 7 is a graph representing exemplary reflection characteristics of a filter that is a reference example.

FIG. 7 is a graph representing exemplary reflection characteristics of the filter 25. Referring to FIG. 7, a return loss (T1) at the input/output terminal T1 and a return loss (T2) at the input/output terminal T2 are illustrated.

As illustrated in FIG. 7, in the reflection characteristics of the filter 25, the return loss becomes small (that is, a reflected signal becomes large) in a portion from the middle of the pass band to a higher-frequency side (a portion A around 2.0 GHz) and at the lower-frequency end (a portion B around 1.4 GHz) of the pass band. Such characteristics reflect a state in which excellent matching is not performed (also referred to as mismatching) in the whole of the pass band. The decrease in the return loss in the pass band (the increase in the reflected signal) degrades the insertion loss.

Accordingly, a new filter is proposed which has an improved insertion loss while having flat bandpass characteristics in a wide pass band and steep attenuation characteristics at the ends of the pass band like the filter 25.

Figure 8:
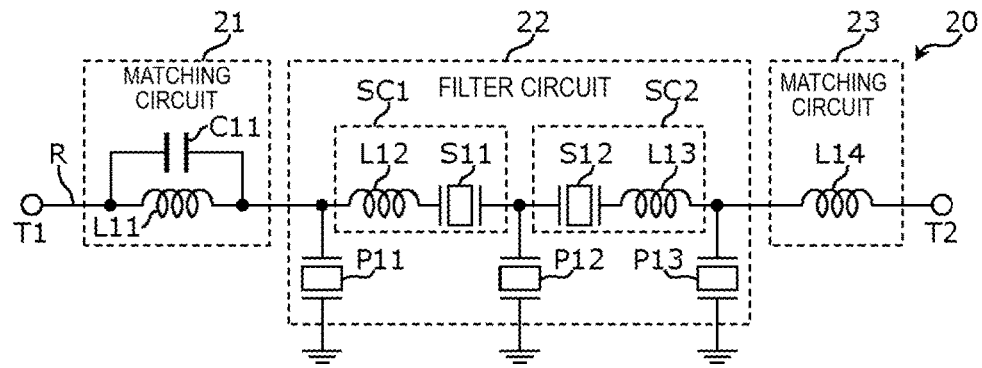
FIG. 8 is a circuit diagram illustrating an exemplary configuration of a filter according to the first embodiment.

FIG. 8 is a circuit diagram illustrating an exemplary configuration of a filter according to the first embodiment. As illustrated in FIG. 8, the filter 20 includes matching circuits 21 and 23 and a filter circuit 22. The matching circuit 21, the filter circuit 22, and the matching circuit 23 are connected in series with each other in this order and form the signal path R connecting the input/output terminals T1 and T2. The matching circuits 21 and 23 do not necessarily have to be provided, and any one or both of them may be omitted.

The matching circuit 21 includes a capacitor C11 and an inductor L11 that are connected in parallel to each other on the signal path R.

The filter circuit 22 includes series circuits SC1 and SC2 provided on the signal path R and parallel arm resonators P11, P12, and P13 each connected between one end of the series circuit SC1 or SC2 and the ground. The series circuit SC1 includes an inductor L12 and a series arm resonator S11 that are connected in series with each other. The series circuit SC2 includes a series arm resonator S12 and an inductor L13 that are connected in series with each other.

The matching circuit 23 includes an inductor L14 on the signal path R.

Each of the series arm resonators S11 and S12 and the parallel arm resonators P11, P12, and P13 is formed of an elastic wave resonator.

Figure 9:
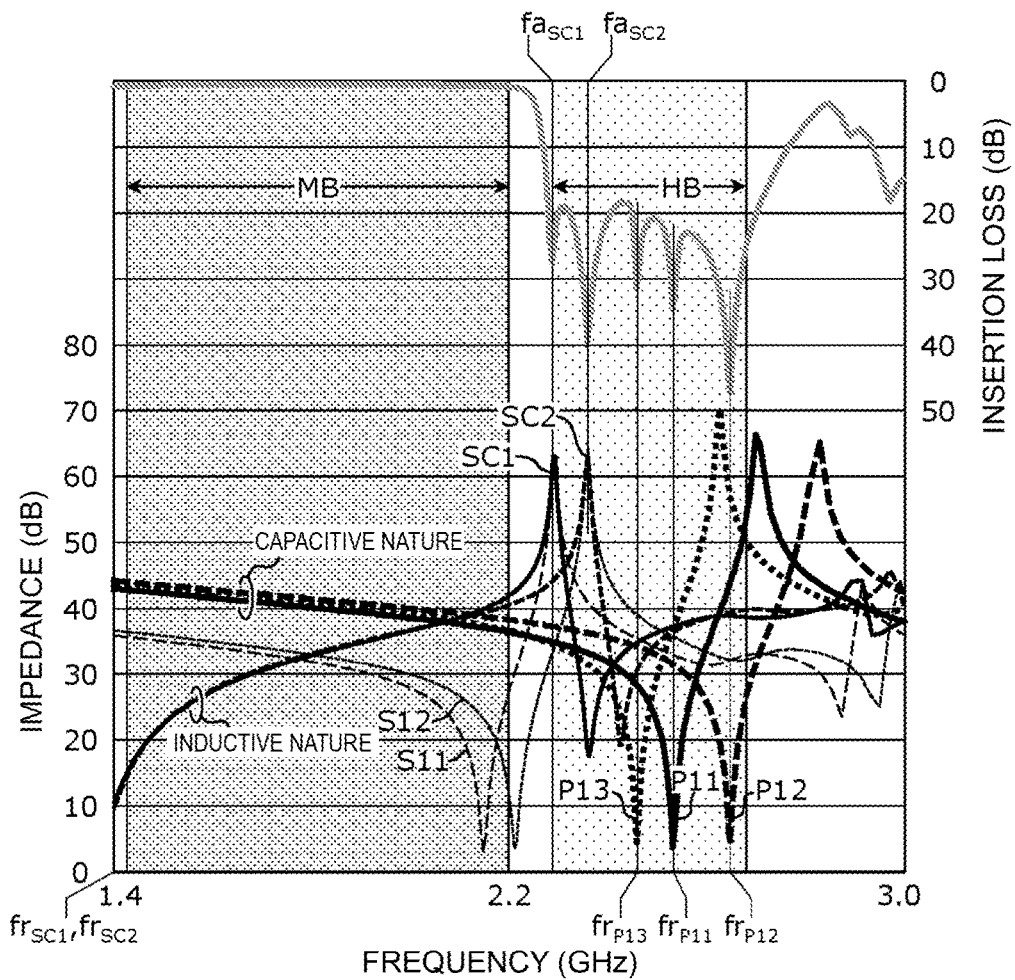
FIG. 9 is a graph representing exemplary resonance characteristics of a filter according to the first embodiment.

FIG. 9 is a graph representing exemplary resonance characteristics of the filter 20. Referring to FIG. 9, a plurality of black lines of different line types represent the impedances of the series arm resonators S11 and S12, the series circuits SC1 and SC2, and the parallel arm resonators P11, P12, and P13, and a gray line represents the bandpass characteristics of the filter 20.

The impedance of the parallel circuit SC1 is the series combined impedance of the inductor L12 and the series arm resonator S11. An anti-resonant frequency $fa_{SC1}$ of the series circuit SC1 is the same as the anti-resonant frequency of the single series arm resonator S11. A resonant frequency $fr_{SC1}$ of the series circuit SC1 is shifted by the inductor L12 from the resonant frequency of the single series arm resonator S11 to a lower-frequency side.

The impedance of the series circuit SC2 is the series combined impedance of the series arm resonator S12 and the inductor L13. An anti-resonant frequency $fa_{SC2}$ of the series circuit SC2 is the same as the anti-resonant frequency of the single series arm resonator S12. A resonant frequency $fr_{SC2}$ of the series circuit SC2 is shifted by the inductor L13 from the resonant frequency of the single series arm resonator S12 to the lower-frequency side.

The anti-resonant frequency $fa_{SC1}$ of the series circuit SC1, the anti-resonant frequency $fa_{SC2}$ of the series circuit SC2, a resonant frequency $fr_{P11}$ of the parallel arm resonator P11, a resonant frequency $fr_{P12}$ of the parallel arm resonator P12, and a resonant frequency $fr_{P13}$ of the parallel arm resonator P13 are set in the high band HB.

More specifically, the anti-resonant frequency $fa_{SC1}$ of the series circuit SC1 and the anti-resonant frequency $fa_{SC2}$ of the series circuit SC2 are higher than the frequency at the higher-frequency end of the pass band (the mid-band MB). The resonant frequency $fr_{P11}$ of the parallel arm resonator P11, the resonant frequency $fr_{P12}$ of the parallel arm resonator P12, and the resonant frequency $fr_{P13}$ of the parallel arm resonator P13 are higher than the anti-resonant frequency $fa_{SC1}$ of the series circuit SC1 and the anti-resonant frequency $fa_{SC2}$ of the series circuit SC2.

At the anti-resonance points of the series circuits SC1 and SC2 and the resonance points of the parallel arm resonators P11, P12, and P13, five attenuation poles are formed in the bandpass characteristic of the filter 20. A stop band connecting the five attenuation poles is formed in the high band HB. In particular, the attenuation pole of the series circuit SC1 forms steep attenuation characteristics at the higher-frequency end of the mid-band MB.

The whole of the mid-band MB is located between the resonance point and anti-resonance point of each of the series circuits SC1 and SC2. The whole of the mid-band MB is located on the lower-frequency side of the resonance points of the parallel arm resonators P11, P12, and P13. Accordingly, in the whole of the mid-band MB, the series circuits SC1 and SC2 function as inductive circuit elements, and the parallel arm resonators P11, P12, and P13 function as capacitive circuit elements.

Figure 10:
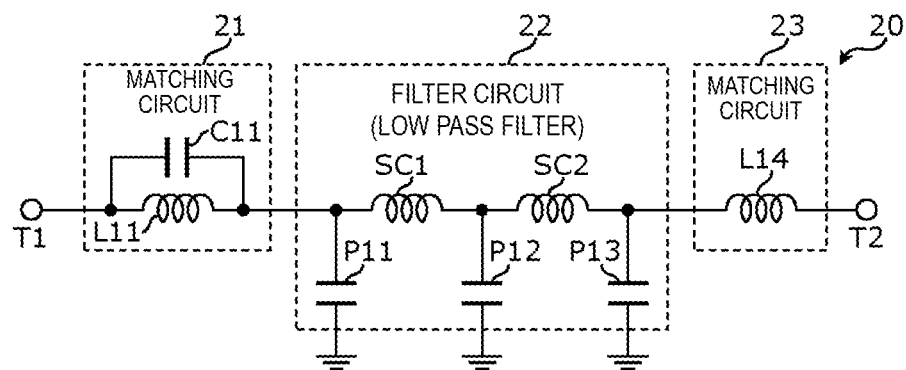
FIG. 10 is an equivalent circuit diagram of a filter according to the first embodiment in a pass band.

FIG. 10 is an equivalent circuit diagram of the filter 20 in the pass band of the filter 20, that is, the mid-band MB. Referring to FIG. 10, the series circuits SC1 and SC2 are represented as inductors, and the parallel arm resonators P11, P12, and P13 are represented as capacitors. As illustrated in the equivalent circuit in FIG. 10, in the pass band, the filter circuit 22 functions as a low pass filter including a simple LC filter that does not use the resonance point and anti-resonance point of a resonator. As a result, flat bandpass characteristics in a wide pass band, which are typical characteristics of an LC filter, can be obtained.

Thus, like the filter 25 described above, the filter 20 uses the characteristics of an LC filter and the characteristics of an elastic wave filter in combination in accordance with the locations of the anti-resonant frequencies of series arm resonators and the resonant frequencies of parallel arm resonators, thereby realizing wide-band bandpass characteristics and steep attenuation characteristics at the ends of a pass band.

Unlike the filter 25, the filter 20 includes on the signal path R no capacitive circuit element used to form the pass band. That is, in the filter 20, there is no circuit element functioning as a high pass filter in the pass band. Since the filter circuit 22 functions as a low pass filter including larger number of stages than the filter circuit 27 in the filter 25, attenuation can be ensured in the stop band. As a result, in the filter 20, attenuation that is substantially the same as that in the filter 25 can be realized without the degradation in a matching state in the pass band. This leads to the decrease in the insertion loss in the pass band caused by mismatching and the acquisition of more excellent bandpass characteristics.

Figure 11:
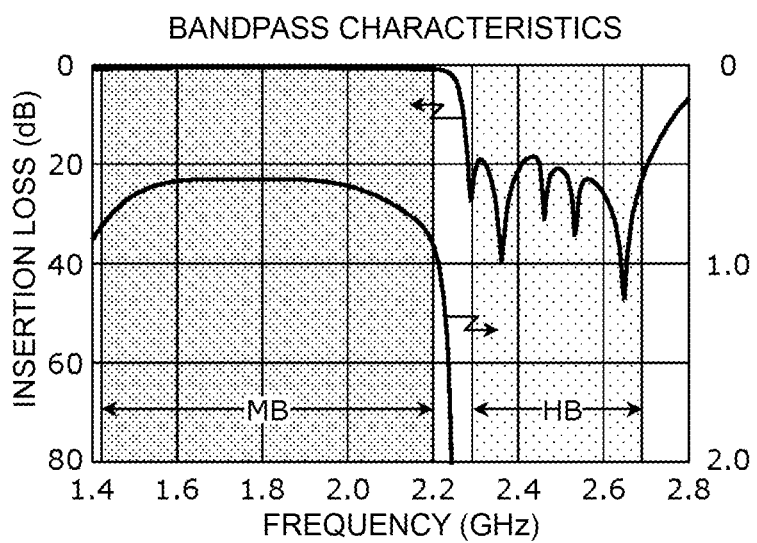
FIG. 11 is a graph representing exemplary bandpass characteristics of a filter according to the first embodiment.

FIG. 11 is a graph representing exemplary bandpass characteristics of the filter 20. Referring to FIG. 11, the insertion loss illustrated in FIG. 9 is illustrated again, and the waveform in the mid-band MB is enlarged. It is apparent from FIG. 11 that wide-band bandpass characteristics in which an insertion loss is smaller than or equal to a predetermined amount (for example, approximately 1.0 dB) in the whole of the mid-band MB with the fractional bandwidth of approximately 40% or greater are obtained, and steep attenuation characteristics at the higher-frequency end of the mid-band MB are obtained.

As compared with the bandpass characteristic of the filter 25 (FIG. 6), the bandpass characteristics of the filter 20 are improved as a result of the decrease in the insertion loss in the pass band and the increase in the attenuation in the stop band.

Figure 12:
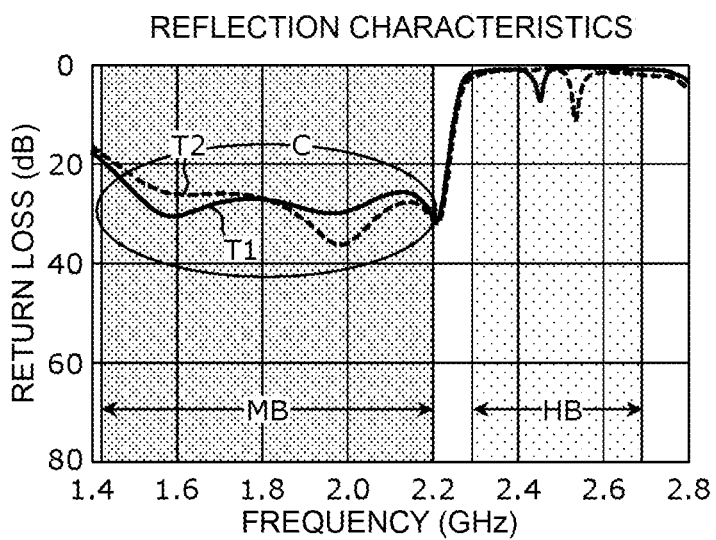
FIG. 12 is a graph representing exemplary reflection characteristics of a filter according to the first embodiment.

FIG. 12 is a graph representing exemplary reflection characteristics of the filter 20. FIG. 12 illustrates a return loss (T1) at the input/output terminal T1 and a return loss (T2) at the input/output terminal T2.

As illustrated in FIG. 12, in the reflection characteristics of the filter 20, the decrease in the return loss, which occurs in the portions A and B in the reflection characteristic of the filter 25 (FIG. 7), is suppressed and a large return loss is maintained in the whole of the pass band (a portion C in FIG. 12). It is apparent from this fact that a matching state is improved in the whole of the pass band in the filter 20 as compared with that in the filter 25.

As described above, like the filter 25, the filter 20 uses the characteristics of an LC filter and the characteristics of an elastic wave filter in combination in accordance with the locations of the anti-resonant frequencies of series arm resonators and the resonant frequencies of parallel arm resonators. As a result, like the filter 25, the filter 20 can acquire wide-band bandpass characteristics and steep attenuation characteristics at the ends of a pass band.

Since the resonant frequencies and anti-resonant frequencies of the series circuits SC1 and SC2 are set such that both of the series circuits SC1 and SC2 become inductive in the pass band, the filter circuit 22 functions as a simple low pass filter in the pass band. The filter 20 therefore easily performs matching in the pass band. As a result, the loss caused by mismatching is suppressed, and more excellent bandpass characteristic can be obtained.

The above-described configuration of the filter 20 is illustrative. The following modification or limitation may be made to the filter 20.

For example, in the filter 20, each of the inductors L12 and L13 may be formed of a multilayer chip inductor. In this case, the Q values of the inductors L12 and L13 can be increased as compared with a case where the inductors L12 and L13 are formed in a substrate using pattern conductors. As a result, the insertion loss of the filter 20 can be further decreased.

The Q value of each of the inductors L12 and L13 may be larger than that of the matching inductors L11 and L14.

In this case, since inductors whose Q values are relatively large (for example, larger than the Q values of the inductors L11 and L14) are used as the inductor L12 and L13, the insertion loss can be decreased in the wide pass band while the steepness of attenuation characteristics at the higher-frequency end of the pass band is increased.

An exemplary case where the pass band of the filter 20 is the mid-band MB has been described above. However, the pass band of the filter 20 is not limited to the frequency band called the mid-band MB. The filter 20 can be used as a filter having any wide frequency band as the pass band on the higher-frequency side of which another adjacent frequency band is present via a narrow frequency gap.

Second Embodiment

A multiplexer according to the second embodiment will be described by taking a triplexer including a filter according to the first embodiment as an example.

Figure 13:
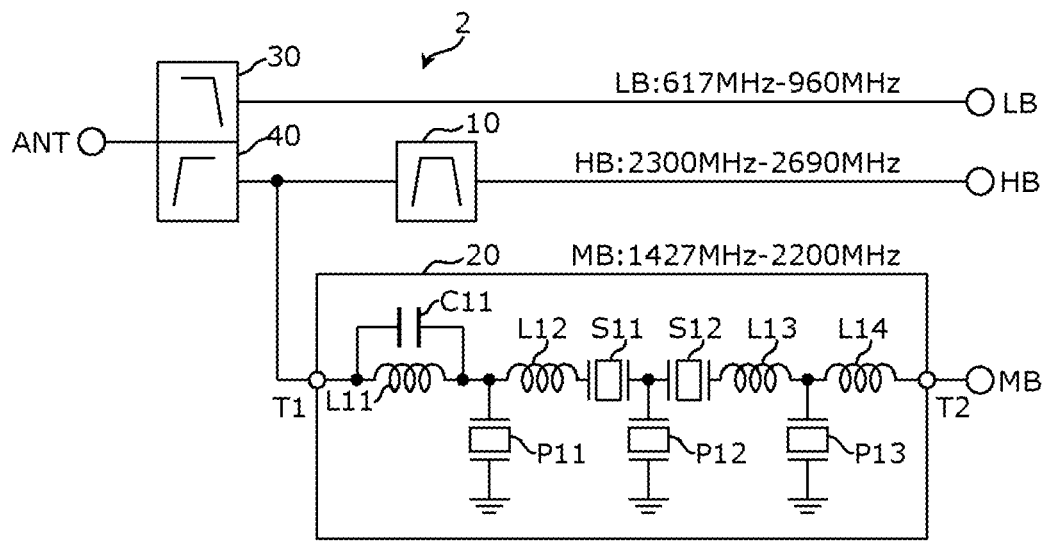
FIG. 13 is a block diagram illustrating an exemplary configuration of a multiplexer according to a second embodiment.

FIG. 13 is a block diagram illustrating an exemplary configuration of a multiplexer according to the second embodiment. As illustrated in FIG. 13, a multiplexer 2 includes filters 30 and 40 in addition to the filters 10 and 20 that are referred to in the first embodiment. The multiplexer 2 is a triplexer that demultiplexes and multiplexes signals in the pass bands of the filters 10, 20, and 30. The filters 10, 20, and 30 are examples of a first filter, a second filter, and a third filter, respectively.

Referring to FIG. 13, for example, the pass band of the filter 30 is set to fall within the range of approximately 617 MHz to approximately 960 MHz. In this specification, for convenience in reference, the frequency band of approximately 617 MHz to approximately 960 MHz is referred to as a low band LB.

The pass band of the filter 10 is the high band HB of approximately 2300 MHz to approximately 2690 MHz. The pass band of the filter 20 is the mid-band MB of approximately 1427 MHz to approximately 2200 MHz. The pass band of the filter 40 is the combination of the high band HB and the mid-band MB.

One end of the filter 30 and one end of the filter 40 are connected to the antenna terminal ANT. The other end of the filter 30 is connected to a low band terminal LB. One end of the filter 10 and one end of the filter 20 are connected to the other end of the filter 40. The other end of the filter 10 is connected to the high band terminal HB. The other end of the filter 20 is connected to the mid-band terminal MB. One ends of the filters 10, 20, and 30 are directly connected to each other or indirectly connected to each other via the filter 40.

The filter 10 is formed of an LC resonant circuit and an elastic wave resonator (not illustrated). The LC resonant circuit in the filter 10 forms the wide pass band in the high band HB, and the elastic wave resonator in the filter 10 forms steep attenuation characteristics at the lower-frequency end of the high band HB.

The filter 30 is formed of an LC resonant circuit. The LC resonant circuit in the filter 30 forms the wide pass band in the low band LB.

Figure 14:
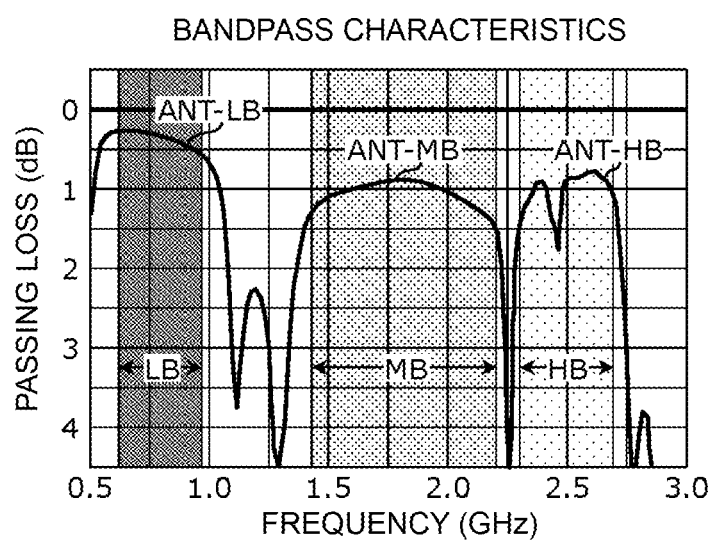
FIG. 14 is a graph representing exemplary bandpass characteristics of a multiplexer according to the second embodiment.

FIG. 14 is a graph representing exemplary bandpass characteristics of the multiplexer 2. In the filter 10 used in the high band HB which is included in the multiplexer 2, using the steep frequency characteristics of the elastic wave resonator in the filter 10, steep attenuation characteristics can be formed at the lower-frequency end of the pass band and a signal in the mid-band MB can be sufficiently blocked. Since a signal in the high band HB and a signal in the mid-band MB are completely separated despite the narrow frequency gap between them by using the filters 10 and 20, both of these signals can be simultaneously transmitted and received by a single antenna. As a result, the communication based on carrier aggregation of a communication band in the high band HB and a communication band in the mid-band MB can be performed with a single antenna.

Although a filter according to an embodiment of the present disclosure and a multiplexer according to an embodiment of the present disclosure have been described, the present disclosure is not limited to each embodiment. Various modifications to the embodiments that can be conceived by those skilled in the art, and forms configured by combining constituent elements in different embodiments without departing from the teachings of the present disclosure may be included in the scope of one or more aspects of the present disclosure.

CONCLUSION

A filter according to a preferred embodiment of the present disclosure is a filter having a pass band. The filter includes a series circuit in which a series arm resonator and a first inductor are connected in series with each other and which forms at least part of a signal path connecting a first input/output terminal and a second input/output terminal and a parallel arm resonator connected between one end of the series circuit and a ground. The series circuit becomes inductive in the pass band.

With this configuration, the series circuit including the series arm resonator and the parallel arm resonator are connected in a ladder form. By forming each of the series arm resonator and the parallel arm resonator using an elastic wave resonator, steep attenuation characteristics at the ends of the pass band, which are typical characteristics of ladder elastic wave filters, can be obtained on the basis of an attenuation pole formed by the anti-resonance of the series arm resonator. Since the series circuit becomes inductive in the pass band, the filter functions as a low pass filter including an LC filter in the pass band. Excellent matching can therefore be easily performed in the whole of the pass band and an insertion loss can be effectively suppressed. As a result, a filter can be obtained which has a small insertion loss while having a wide pass band and steep attenuation characteristics at the ends of the pass band.

An anti-resonant frequency of the series circuit may be higher than a frequency at a higher-frequency end of the pass band. A resonant frequency of the parallel arm resonator may be higher than the anti-resonant frequency of the series circuit.

With this configuration, an attenuation pole near the higher-frequency end of the pass band is formed by the anti-resonance of the series arm resonator, and an attenuation pole far from the higher-frequency end of the pass band is formed by the resonance of the parallel arm resonator. As a result, a filter can be realized which has a small loss in the pass band while realizing steep attenuation characteristics at the higher-frequency end of the pass band using the anti-resonance of the series arm resonator.

The filter further includes a second matching inductor connected to at least one of a first portion between the series circuit and the first input/output terminal on the signal path and a second portion between the series circuit and the second input/output terminal on the signal path. A Q value of the first inductor is larger than a Q value of the second matching inductor in the pass band.

With this configuration, an inductor having a relatively large Q value is used as the first inductor. Accordingly, an insertion loss can be reduced in the wide pass band while the steepness of attenuation characteristics at the higher-frequency end of the pass band is increased.

The filter may have a pass band of approximately 1427 MHz to approximately 2200 MHz and a stop band of approximately 2300 MHz to approximately 2690 MHz.

With this configuration, a filter is obtained which has the mid-band and the high band described in this specification as the pass band and the stop band, respectively. Such a filter is suitable for a mid-band filter in a multiplexer that demultiplexes and multiplexes a signal in the high band and a signal in the mid-band.

A multiplexer according to a preferred embodiment of the present disclosure includes a first filter having a pass band of approximately 2300 MHz to approximately 2690 MHz, a second filter that is the above-described filter, and a third filter having a pass band of approximately 617 MHz to approximately 960 MHz. One end of the first filter, one end of the second filter, and one end of the third filter are connected to each other.

With this configuration, a multiplexer is obtained which demultiplexes and multiplexes signals in three frequency bands, the above-described high band, the above-described mid-band, and a low band.

The first filter may be formed of an LC resonant circuit and an elastic wave resonator. The third filter may be formed of an LC resonant circuit.

With this configuration, in the first filter used in the high band, steep attenuation characteristics can be formed at the lower-frequency end of the pass band using the steep frequency characteristics of an elastic wave resonator. By using the first filter and the second filter, a signal in the high band and a signal in the mid-band are completely separated.

Both of these signals can therefore be simultaneously transmitted and received by a single antenna. As a result, the communication based on carrier aggregation of a communication band in the high band and a communication band in the mid-band can be performed with a single antenna.

The present disclosure can be widely applied to communication devices such as cellular phones as, for example, a filter and a multiplexer.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A filter having a pass band, the filter comprising:
a series circuit in which a series arm resonator and a first inductor are connected in series with each other and which forms at least part of a signal path connecting a first input/output terminal and a second input/output terminal;
a parallel arm resonator connected between one end of the series circuit and a ground;
a second inductor connected to at least one of a first portion between the series circuit and the first input/output terminal on the signal path or a second portion between the series circuit and the second input/output terminal on the signal path; and a capacitor connected in parallel to the second inductor, wherein the series circuit becomes inductive in the pass band, wherein an anti-resonant frequency of the series circuit is higher than a frequency at a higher-frequency end of the pass band, and wherein a resonant frequency of the parallel arm resonator is higher than the anti-resonant frequency of the series circuit.

2. The filter according to claim 1, wherein the first inductor is a multilayer chip inductor.

3. The filter according to claim 1, wherein the second inductor is a matching inductor, and wherein a Q value of the first inductor is larger than a Q value of the second inductor in the pass band.

4. The filter according to claim 1, wherein the filter has a pass band of approximately 1427 MHz to approximately 2200 MHz and a stop band of approximately 2300 MHz to approximately 2690 MHz.

5. The filter according to claim 1, wherein the second inductor is connected to the second portion between the series circuit and the second input/output terminal on the signal path.

6. The filter according to claim 1, wherein the capacitor and the second inductor are connected to the first portion between the series circuit and the first input/output terminal on the signal path.

7. A multiplexer comprising:

a first filter formed of a first LC resonant circuit and an elastic wave resonator, the first filter having a pass band of approximately 2300 MHz to approximately 2690 MHz;

a second filter comprising:
 a series circuit in which a series arm resonator and a first inductor are connected in series with each other and which forms at least part of a signal path connecting a first input/output terminal and a second input/output terminal;
 a second inductor connected to at least one of a first portion between the series circuit and the first input/output terminal on the signal path or a second portion between the series circuit and the second input/output terminal on the signal path;
 a capacitor connected in parallel to the second inductor; and
 a parallel arm resonator connected between one end of the series circuit and a ground, wherein an anti-resonant frequency of the series circuit is higher than a frequency at a higher-frequency end of the pass band, wherein a resonant frequency of the parallel arm resonator is higher than the anti-resonant frequency of the series circuit; and a third filter formed of a second LC resonant circuit and having a pass band of approximately 617 MHz to approximately 960 MHz, wherein one end of the first filter, one end of the second filter, and one end of the third filter are connected to each other.

8. A filter having a pass band, the filter comprising:

a series circuit in which a first inductor and a second inductor are connected in a series arm which forms at least part of a signal path connecting a first input/output terminal and a second input/output terminal;

a parallel arm resonator connected between one end of the series circuit and a ground; and a third inductor connected to at least one of a first portion between the series circuit and the first input/output terminal on the signal path or a second portion between the series circuit and the second input/output terminal on the signal path, wherein the series circuit becomes inductive in the pass band, wherein an anti-resonant frequency of the series circuit is higher than a frequency at a higher-frequency end of the pass band, and wherein a resonant frequency of the parallel arm resonator is higher than the anti-resonant frequency of the series circuit, and wherein a Q value of the first inductor and the second inductor is larger than a Q value of the third inductor in the pass band.

9. The filter according to claim 8, wherein the third inductor is a matching inductor.

10. The filter according to claim 9, further comprising a capacitor connected in parallel to the third inductor, wherein the capacitor and the third inductor are connected to the first portion between the series circuit and the first input/output terminal on the signal path.

11. The filter according to claim 9, wherein the third inductor is connected to the second portion between the series circuit and the second input/output terminal on the signal path.

* * * * *